(12) United States Patent
Van Der Pasch et al.

(10) Patent No.: US 7,362,446 B2
(45) Date of Patent: Apr. 22, 2008

(54) POSITION MEASUREMENT UNIT, MEASUREMENT SYSTEM AND LITHOGRAPHIC APPARATUS COMPRISING SUCH POSITION MEASUREMENT UNIT

(75) Inventors: Engelbertus Antonius Fransiscus Van Der Pasch, Oirschot (NL); Erik Roelof Loopstra, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 242 days.

(21) Appl. No.: 11/226,460

(22) Filed: Sep. 15, 2005

(65) Prior Publication Data

US 2007/0058172 A1    Mar. 15, 2007

(51) Int. Cl.
*G01B 11/02*    (2006.01)

(52) U.S. Cl. .................. 356/499; 356/508; 355/53

(58) Field of Classification Search ............... 356/492, 356/493, 494, 499, 508, 509, 521
See application file for complete search history.

(56) References Cited

U.S. PATENT DOCUMENTS 4,881,815 A * 11/1989 Sommargren ............ 356/487
6,483,593 B1 * 11/2002 Bell et al. ............... 356/487
7,292,312 B2 * 11/2007 Loopstra et al. ............ 355/53
2004/0263841 A1   12/2004 Caracci et al.
2004/0263846 A1 * 12/2004 Kwan ..................... 356/399

* cited by examiner

*Primary Examiner*—Gregory J. Toatley, Jr.
*Assistant Examiner*—Scott M Richey
(74) *Attorney, Agent, or Firm*—Pillsbury Winthrop Shaw Pittman LLP

(57) ABSTRACT

A measurement unit to determine a position in a first and second dimension includes a diffraction type encoder and an interferometer. The diffraction type encoder determines by means of a diffraction on a first and a second diffraction grating the position in the first dimension of the second grating with respect to the first grating, The interferometer determines the position in the second dimension of a mirror. The measurement unit includes a combined optical unit to transfer an encoder measurement beam as well as an interferometer measurement beam. Further, the measurement unit may include a combined light source for the encoder as well as the interferometer. One of the first and second diffraction gratings may further show some degree of zero order reflection to provide the mirror of the interferometer.

19 Claims, 7 Drawing Sheets

POSITION MEASUREMENT UNIT, MEASUREMENT SYSTEM AND LITHOGRAPHIC APPARATUS COMPRISING SUCH POSITION MEASUREMENT UNIT

BACKGROUND

1. Field of the Invention

The present invention relates to a position measurement unit, a measurement system and a lithographic apparatus comprising such position measurement unit.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In lithographic apparatuses, position measurements, e.g. of a position of the substrate table, in a plural degrees of freedom (DOF) are required. Examples of such position measurement systems are described in US 2004/0263846, which is included herein by reference. This document describes measurement systems to determine a position of the substrate table in up to 6 degrees of freedom, the measurement systems comprising a combination of optical interferometers and encoders. In this document, a plane in which the substrate table moves when performing scanning or stepping movements, is defined as an X, Y plane while a dimension perpendicular thereto has been defined as a Z plane. The X, Y plane substantially corresponds to a surface of a substrate held by the substrate table. Also, US 2004/0263841 describes measurement systems to determine a position of a mask table to hold the mask or reticle, in up to 6 degrees of freedom. Here similarly, a surface of the mask substantially coincides with the X, Y plane, while the dimension is substantially perpendicular thereto. In the examples shown, the measurement system comprises a combination of interferometers and encoders. Generally speaking, in some of the examples given here, the interferometers are applied to determine a position (or in fact more precisely to determine a distance) in the X dimension or Y dimension, while the encoders are generally speaking applied to determine a distance in the Z dimension. A range of movement of the substrate table or the mask table may be, during operation of the lithographic apparatus, far larger in the X and Y dimension than in the Z dimension. Also, accuracy requirements may differ per dimension. In another example, as shown in FIGS. 6 and 7 of this document, encoders are applied for measuring a position of the substrate table in X and Y dimension, while an interferometer is applied for measuring the position of the substrate table in the Z dimension. As shown in FIGS. 6 and 7, for each dimension a separate measurement unit is applied. Commonly, it is desired to measure a position of e.g. the substrate table in 6 degrees of freedom, which would require, making use of the solutions as presented in this document, at least 6 measurement units (comprising either an interferometer or an encoder).

One of the ever increasing demands on a lithographic apparatus is to increase a yield thereof, which translates into a higher member of the wafers to be processed in a certain timespan, hence a faster handling, shorter illumination time, etc. of each substrate to be processed. To achieve such a goal, it is desired to increase a speed of movement (e.g. a scanning speed or stepping speed) of the substrate table to allow a faster irradiation of the surface of the substrate. Also, a diameter of the wafer or substrate tends to increase with every generation of lithographic apparatuses. Now, conflicting requirements come into existence, as high speeds of movement of the substrate table on the one hand require a low mass thereof, while on the other hand increasing diameters of the wavers require a more large substrate table, which translates into a higher mass thereof. These conflicting requirements are even worsened by the measurement solutions as presented in US 2004/0263846, as each of the detectors (interferometers or encoders) requires an additional area on a surface of the substrate table, thus increasing a dimension and a weight of the substrate table even further.

A further aspect which comes forward in the measurement solutions as presented in FIGS. 6 and 7 of US 2004/0263846 is that the individual interferometers, encoders, etc. are to be aligned with respect to each other to remove errors due to e.g. misalignments, etc. between them. Also, the physical distance between the beams of the interferometers and encoders in for example the solution presented in FIG. 7 of the document referred to above, may lead to additional measurement errors in case that the grid is not absolutely parallel to the surface of the substrate table, hence requiring a calibration to correct for these errors.

Examples of a refraction type encoder are described in Digitale Laengen- und Winkelmesstechnik: Positionsmesssysteme fuer den Maschinenbau und die Elektronikindustrie, Alfons Ernst [Heidenhain], (1998), as well as in Laengen in der Ultrapraezisionstechnik messen, Alfons Spies, Feinwerk & Messtechnik 98 (1990) 10 page 406-410, which are included herein by reference.

SUMMARY

It is desirable to provide a compact position measurement unit e.g. for a lithographic apparatus.

According to an embodiment of the invention, there is provided a measurement unit to determine a position in a first and a second dimension, comprising: a diffraction type encoder to determine by means of a diffraction of an encoder measurement beam on a first and a second diffraction grating the position in the first dimension of the second grating with respect to the first grating, an interferometer to determine by means of an interference between an interferometer measurement beam following a reference path and a measurement path respectively, the position in the second dimension of a mirror in the measurement path, the measurement unit comprising a combined optical unit to transfer the encoder measurement beam as well as the interferometer measurement beam.

In another embodiment of the invention, there is provided a measurement system to determine a position of an object in six degrees of freedom, the measurement system comprising three measurement units according to the invention.

According to a further embodiment of the invention, there is provided a lithographic apparatus comprising a measurement unit according to the invention, the measurement unit being connected to a substrate table to measure a position of the substrate table.

According to a still further embodiment of the invention, there is provided a lithographic apparatus comprising a measurement unit according to the invention, the measurement unit being connected to a mask table to measure a position of the mask table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
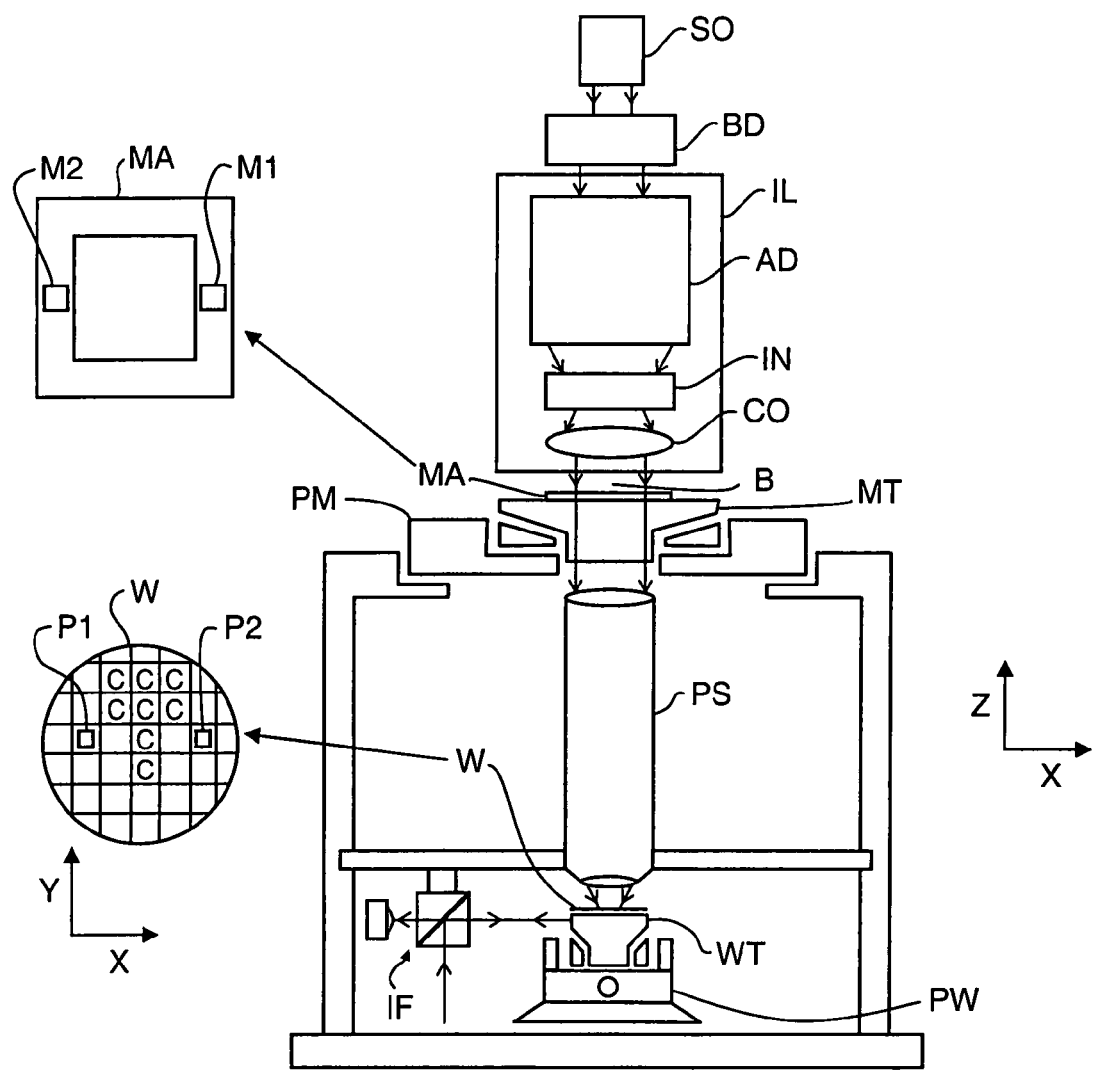
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at once (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilises programmable patterning device, such as a programmable mirror array of a type as referred to above.

Combinations and/or variations on the above described modes of use or entirely different modes of use may also be employed.

Figure 2B:
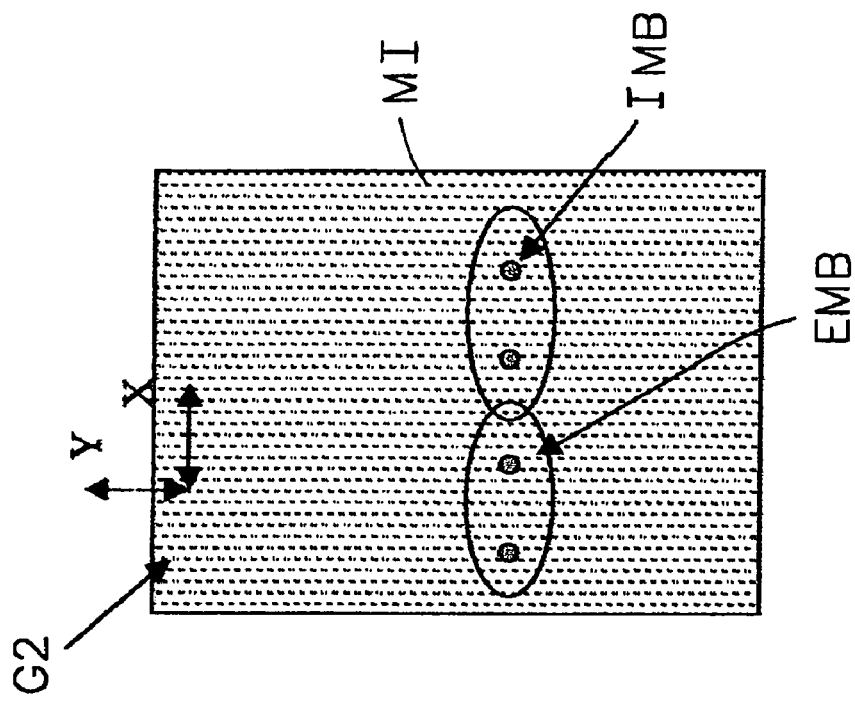
FIGS. 2a and 2b depict a position measurement unit according to an embodiment of the invention.
Figure 2A:
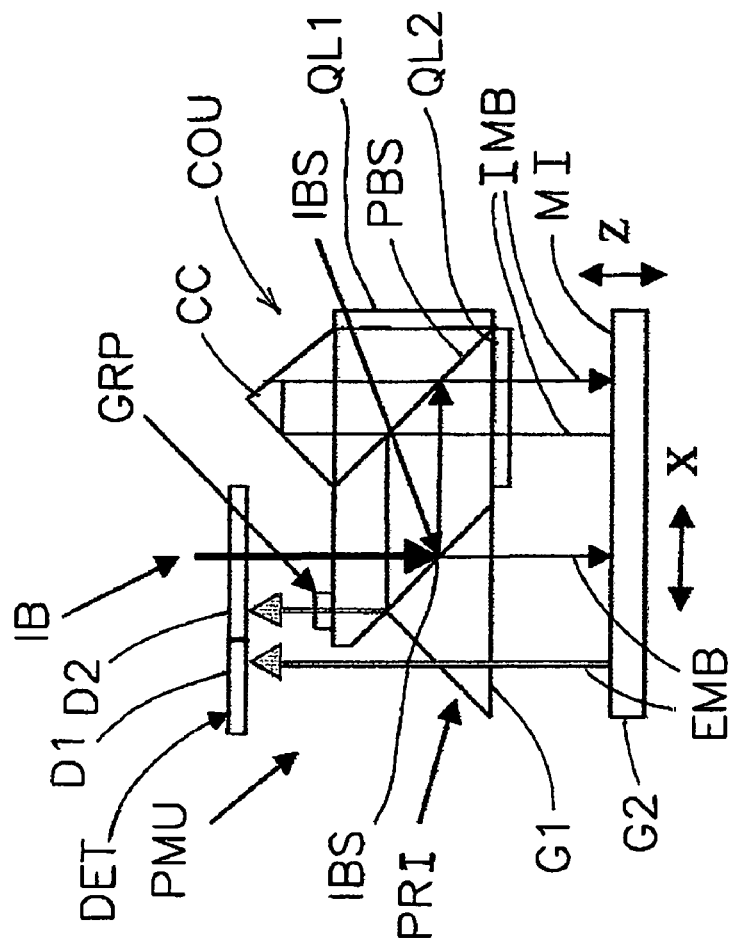

An example of the measurement unit will now be described with reference to FIGS. 2a and 2b. It is remarked that throughout the FIG. 2 and following, an X and Y dimension are defined as forming a plane which substantially coincides with a grating of the encoder, while a Z dimension forms a dimension perpendicular thereto. FIG. 2a shows a schematic side view (partly in cross-section) of a measurement unit according to an embodiment of the invention. The measurement unit comprises an interferometer which is formed by the polarizing beamsplitter PBS, corner cube CC, mirror MI and detector D2 and quarter lambda plates QL1, QL2. More precisely, QL1 comprises a quarter lambda plate with on top a reflective mirror coating thereby forming a reference path mirror. Further, the measurement unit comprises an encoder, in particular a diffraction type encoder which comprises gratings G1 and G2, prism PRI and encoder detector D1. The measurement unit comprises a combined optical unit COU, which comprises interferometer optics as well as encoder optics. The interferometer optics comprise the polarizing beamsplitter PBS, corner cube CC and quarter lambda plates QL1, QL2, while the encoder optics comprise prism PRI and grating G1. An encoder measurement beam EMB of the encoder as well as an interferometer measurement beam IMB of the interferometer. By combining the optics of the interferometer and the encoder into a single unit, it may be achieved that dimensions of the measurement unit thus provided may be reduced thus requiring less space on a surface of the substrate table WT, as well as enabling to reduce a weight thereof. Therefore, conflicting requirements as to scanning speed, wafer size, weight of the wafer table, etc may be balanced in a more favourable way, as the measurement unit thus provided requires less surface area on the substrate table, as well as a lower combined weight then individual interferometers and encoders taken together, and thereby also enables to reduce a size of the substrate table due to the small dimensions of the measurement unit which translate into a lower mass of the substrate table, which favours higher accelerations and higher speeds thereof. Also, as use is made of combined optics, a higher correlation between a measurement by the interferometer and by the encoder may be obtained, which may result in a higher accuracy of a measurement system of which the measurement unit may form part.

The encoder measures a position of the first grating G1 with respect to the second grating G2 in a dimension substantially parallel to the X axis as drawn in FIG. 2a. The interferometer measures a position in a dimension substantially parallel to the Z axis, i.e. in a dimension substantially perpendicular to the grating G2.

It is remarked that when in this document the term position or position measurement is used, this may be understood as comprising an absolute position or a relative position, i.e. a position increment.

The interferometer by its measurement principle commonly measures a difference in a length of an optical measurement path as compared to an optical reference path. The measurement path is followed by a beam which from the polarizing beam splitter PBS travels towards and reflects on the mirror MI (in this particular example followed by two reflections in the corner cube CC, which take place under an angle to deflect the beam in the corner cube CC, followed by a second reflection on the mirror MI, after which the beam follows the measurement path towards the detector). The reference path is followed by a beam which passes the polarizing beam splitter PBS, travels to the quarter lambda plate/reference mirror QL1 and further following a path (as known in the state of the art of interferometer design) towards the interferometer detector D2. It is remarked that the wording the interferometer measurement beam follows the reference path and the measurement path respectively may be understood as implying that a part of an incoming interferometer beam follows the measurement path while another part follows the reference path. By the interferometer measurement principle, a displacement of mirror MI in z direction results in a change in a length of the measurement path resulting in a change in phase difference of the beams travelling the two paths. Therefore, a periodicity in a read out of the interferometer is obtained which stands in a relationship to a wavelength or wavelengths of the interferometer measurement beam IMB applied. The encoder may also provide a periodicity in read out which periodicity is determined by a pitch of the gratings G1 and G2. Instead of the examples given here, the interferometer may comprise any type of interferometer, such as an interferometer to determine by means of an interference between an interferometer measurement beam following the reference path and the measurement path respectively, the position in the second dimension of the mirror in the measurement path.

The encoder may comprise an absolute encoder or a relative encoder. In the examples shown here, a relative encoder is applied, hence a movement of the grating G2 with respect to the grating G1, thus with respect to the combined optical unit COU provides for a periodicity in a read out of detector D1, which periodicity being related to the pitch of the gratings G1 and G2, when the second grating G2 moves with respect to the first grating G1 in a direction parallel to the X axis.

In the examples shown here, the combined optical unit comprises the prism PRI of the encoder and the polarizing beam splitter PBS of the interferometer. The prism PRI in this example comprises a surface (indicated in FIG. 2a by IBS) which extends under an angle of substantially 45 degrees with respect to the X, Y plane, thus the plane formed by the first and the second gratings. This surface transfers the interferometer measurement B to the polarizing beamsplitter PBS. Thus, an incoming beam IB which may comprise a separate beam for the interferometer and the encoder or a combined beam, as will be discussed below, thus at least partly reflects on the surface indicated here as IBS and thereby provides an incoming beam to the interferometer, the incoming beam being directed towards the polarizing beam splitter PBS of the interferometer. For achieving compact dimensions of the combined optical unit as well as a practical alignment, the surface of IBS of the prism PRI extends substantially parallel to a surface of the polarizing beam splitter PBS of the interferometer. Thus, the surface IBS of the prism PRI has dual functions: on the one hand, it functions as a prism of the encoder, which will be described in more detail below, while on the other hand the surface IBS, and in particular a side thereof which faces the polarizing beam splitter PBS functions as an optical transfer means to transfer an incoming beam IB or an interferometer part thereof to the interferometer. This transferring may take place in a plurality of ways, depending on whether or not use is made of a single input beam or separate input beams for the interferometer and the encoder, as will be described below.

The measurement unit may comprise dual input beams IB, one for the encoder, thus to form the encoder measurement beam EMB, and one for the interferometer, thus to form the interferometer measurement beam. Due to a measurement principle of the interferometer, a high wavelength stability of the interferometer measurement beam (IMB) is required, while as for the encoder, substantially less wavelength stability of the encoder measurement beam EMB is required. This is due to the fact that a read out of the interferometer detector D2 shows a periodicity depending on the interferometer beam IMB wavelength, while the encoder detector D1 shows a periodicity in a read out thereof depending on the pitch of the gratings, thus being by its nature less sensitive to a deviation in wavelength. When making use of separate beams, an interferometer input beam and an encoder input beam may be provided, the respective beams may be physically separated from each other in a direction substantially parallel to the Y axis, thus in FIG. 2a in a depth of the drawing. The incoming beam of the interferometer thereby arrives at the surface IBS of the prism PRI at a location which differs from the location at which the incoming beam of the encoder arrives at the surface IBS, a difference there between being in a direction substantially parallel to the Y axis. In an area of the surface IBS where the interferometer input beam arrives at the surface IBS, a reflection may occur by e.g. a reflective coating on the side of the surface IBS facing the polarizing beamsplittter PBS. At the location where the encoder input beam arrives at the surface IBS, an opening in the surface, such as a hole or other means, may be provided to arrange for a transmittal of the encoder input beam towards the second grating G2, thereby avoiding a deflection, reflection or other similar effects on the incoming beam of the encoder. A benefit of making use of separate encoder and interferometer input beams is that suitable wavelengths may be chosen for each of the interferometer and the encoder, and furthermore that these separate input beams enable to make use of a heterodyne measurement principle in the interferometer which makes use of dual wavelengths.

As an alternative to the embodiment described above where dual input beams are applied, it is also possible to make use of a single input beam IB. The single input beam may be provided by a combined light source for the encoder as well as the interferometer. A benefit is that it further reduces a complexity of the measurement unit as only a single light source is required. In this case, the interferometer may comprise a homodyne interferometer which makes use of a single wavelength input beam. Further, a size of the combined optical unit COU may now be reduced even further to some extent, as the encoder and interferometer input beams now coexist, hence enabling to reduce a dimension of the common optical unit COU in the Y direction. The surface IBS of the prism PRI may in this case comprise an incoming beam splitter IBS which splits the single incoming beam IB into the interferometer measurement beam which it directs towards the polarizing beam splitter PBS, and the encoder measurement beam EMB which it directs towards the grating G2. Thus, a part of the incoming beam IB which is reflected by the incoming beamsplitter IBS will serve as an input to the interferometer, while a part of the beam IB which is transferred by the incoming beam splitter IBS serves as incoming beam for the encoder. As the incoming beam splitter is formed by the surface of the prism PRI which extends under 45 degrees with respect to the surface of the gratings G1, G2, it is substantially parallel to the polarizing beamsplitter PBS, thus providing for a high degree of alignment between the interferometer and encoder beams. In the embodiment shown here, the incoming beamsplitter IBS comprises a non-polarizing beamsplitter.

The first and the second dimension may but not necessarily need to be perpendicular. Perpendicularity may be desirable from a measurement point of view as well as a control point of view, as thereby a correlation in dimensions may be avoided, thus allowing an efficient position measurement and control making use of the measurement unit.

It is remarked that in this description, the term interferometer measurement beam IMB and encoder measurement beam EMB refer to optical beams in the interferometer and encoder respectively, however do not specifically refer to a particular beam therein. As an example, in the interferometer the beam is split up by the polarizing beam splitter PBS into a beam which follows a reference path and a beam which follows a measurement path towards and reflecting on the mirror MI. These beams again come together and interfer as detected by the detector D2. The term interferometer measurement beam IMB in this context refers to both these beams in general. Similarly, with the encoder, diffraction takes place on the gratings, resulting in first and minus first order diffraction beams. These beams come together again at the encoder detector, resulting in an interference of the beams. The term encoder measurement beam EMB refers to these beams in general, thus not specifically relating to a particular one thereof. A wavelength of the measurement beam may but not necessarily needs to be in an order of magnitude of about 500-880 nm, more preferably substantially about 780 nm and/or about 633 nm for which wavelength ranges resp. wavelengths highly stable sources and/or suitable gratings, beam splitters, quarter lambda plates etc. may be provided. A source providing the combined input beam or sources providing separate encoder and interferometer measurement beams may be provided as an e.g. integral part of with the detector unit, however may also be located more remotely, the respective beams being e.g. provided via suitable optics such as a waveguide or optical fiber.

Figure 8A:
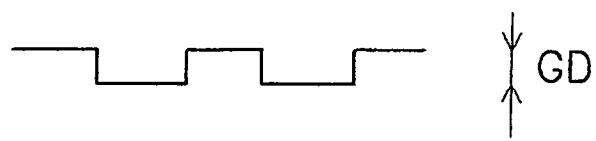
FIGS. 8a and 8b depict a schematic cross sectional view of a grating of the measurement unit according to an embodiment of the invention.
Figure 8B:
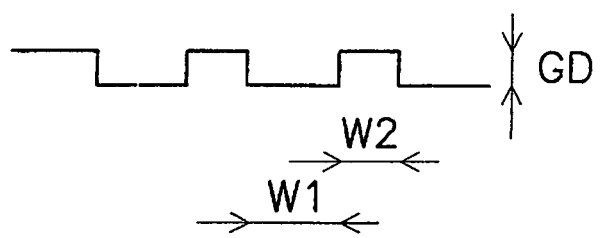

It is possible that a separate grating G2 and a separate mirror MI is used, however the grating G2 and mirror MI may also be combined to provide for a large operating range of the measurement unit, i.e. a large range of movement of the second grating G2 with respect to the combined optical unit COU. As an example, when combining the grating G2 and the mirror MI, a size of such a combined, partly reflecting grating G2 may be orders of magnitude larger than a size of the combined optical unit COU, thereby providing for an operating range in the X dimension, or in the X, Y plane, which is orders of magnitude larger than the dimensions of the common optical unit. Such a partly reflecting grating G2 may be achieved by arranging the grating such that some degree of zero order reflection is provided in addition to the first and minus first order deflection. The skilled person will understand that this objective may be achieved by amending the diffraction grating G2 to achieve a zero order "leakage" thereof, by e.g. altering a length of an optical path in the pattern of the grating such that no 100% extinguishing occurs for zero order reflections. A first example thereof is shown in FIG. 8a where distance GD is slightly unequal to a quarter of a wavelength of the interferometer measurement beam, another example being shown in FIG. 8B where width W1 is slightly unequal to width W2, to achieve a similar effect, a beam width of the interferometer measurement beam being an order of magnitude of W1 plus W2 or larger. In the example shown in FIG. 8b distance GD may not necessarily needs to be equal to a quarter of the wavelength. It is remarked that in FIG. 8a as well as in FIG. 8b, a difference in optical path being equal to twice GD may of course also be in order of an magnitude of 1.5 wavelength, 2.5 wavelength, etc.

In the embodiment shown in FIG. 2a, a single detector unit DET is provided that comprises the encoder detector D1 to detect the encoder measurement beam and the interferometer detector D2 to detect the interferometer measurement beam. The single detector unit may comprise a single printed circuit board on which both detectors D1 and D2 as well as suitable signal processing may be located. Thereby, dimensions of the measurement unit may be reduced, as both detection mechanisms for the encoder as well as the interferometer in this embodiment detect an interference between beams, which reflects into a periodicity in a phase of the respective detector signals, when displacing grating G2 in X direction as for the encoder and in Z direction as for the interferometer. Thereto, a grating plate GRP may be positioned in the optical path of the interferometer beam between the combined optical unit COU and the interferometer detector D2, thereby enabling a substantially similar detection mechanism for the encoder as well as the interferometer detector.

Figure 6:
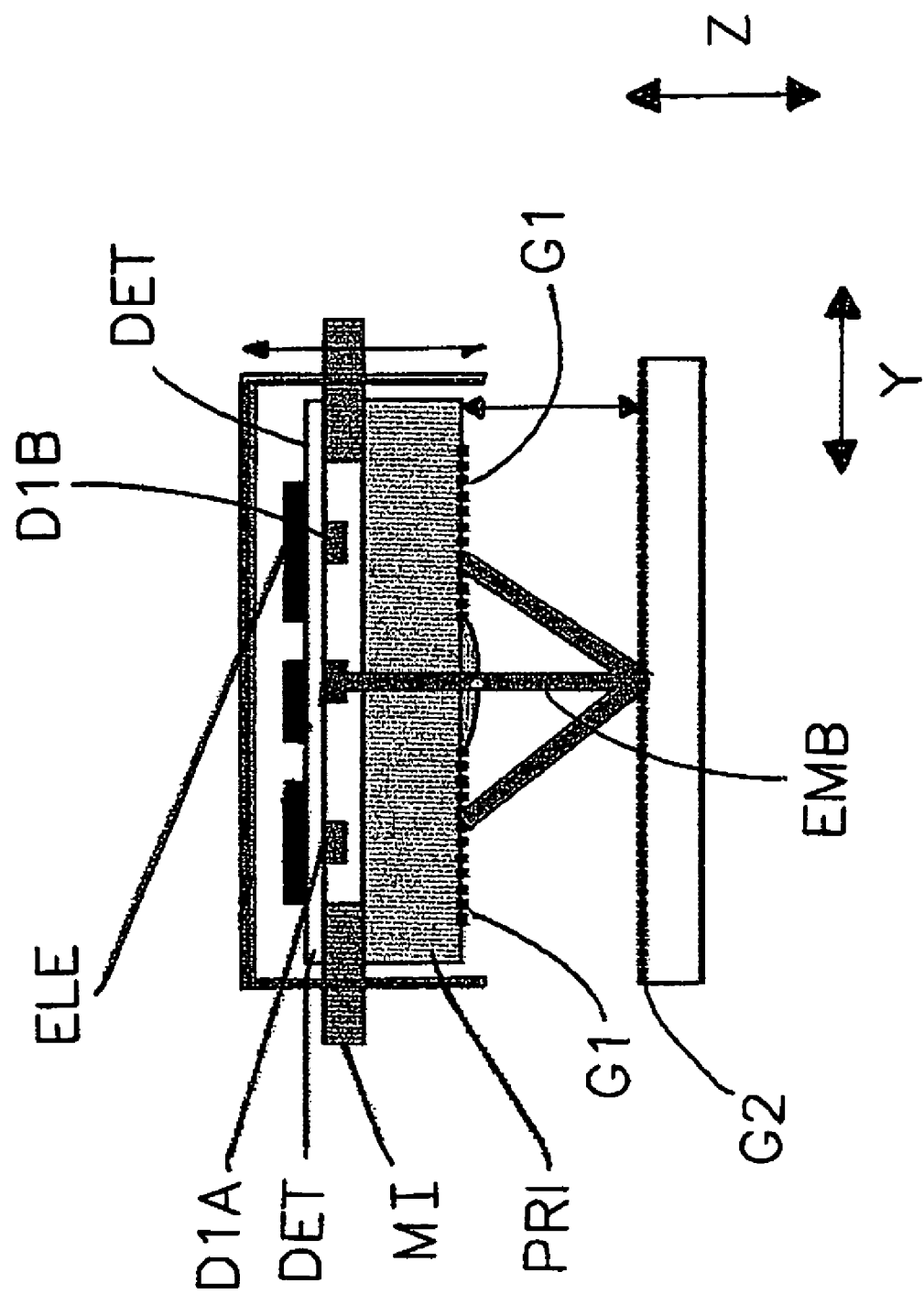
FIG. 6 depicts a cross sectional view of a part of the measurement unit according to an embodiment of the invention.

A different view of the measurement unit according to FIG. 2a is shown in FIG. 6, which depicts a partly cross sectional side view thereof along a plane formed by the Y and Z axis. The view shows the encoder part, thus may be seen as a (partly cross sectional) view from a left side in the view shown in FIG. 2a. FIG. 6 depicts a prism PRI with a grating G1 intergrated therewith, detector units DET and encoder measurement beam EMB. As depicted in FIG. 6, encoder measurement beam EMB is diffracted by the second grating G2 thus providing a first and minus first order beam which is again diffracted by the grating G1, thus again resulting at a beam substantially parallel to the Z axis. An optical path is followed as has been referred to above. The first and second order twice diffracted beams now follow a path through the prism PRI and arrive at detectors D1A, D1B which form part of encoder detector D1. FIG. 6 further shows a mounting interface MI, comprising e.g. a metal frame to hold the detector unit DET and electronics ELE for processing detector signals of the first and second detector. An operation of the diffraction type encoder as applied here is described in more detail in the article Digitale Laengen- und Winkelmesstechnik as well as the article Laengen in der Ultrapraezisionstechnik messen, as referred to above, and which are included herein by reference in their entirety. Reverting back to FIGS. 2a and 2b now, in the embodiment shown here, the corner cube CC to deflect the interferometer measurement beam IMB is constructed in this embodiment to twice deflect the interferometer measurement beam as to reflect at the mirror MI in second instance a location which is more to the left in the plane of drawing of FIG. 2a, thus displaced along the first dimension, i.e. the X dimension. This is also depicted in FIG. 2b, where a top view of grating G2 is shown, the encoder measurement beam EMB being deflected by the grating G2 twice at different locations due to the translation of the encoder measurement beam EMB in X direction by the prism PRI, and the interferometer measurement beam IMB being reflected by the grating G2 twice due to the corner cube CC. As in this example, it is assumed that a single input beam is used, and therefore the encoder measurement beam and interferometer measurement beam arrive at the grating G2 substantially along an imaginary line parallel to the X axis.

Figure 3B:
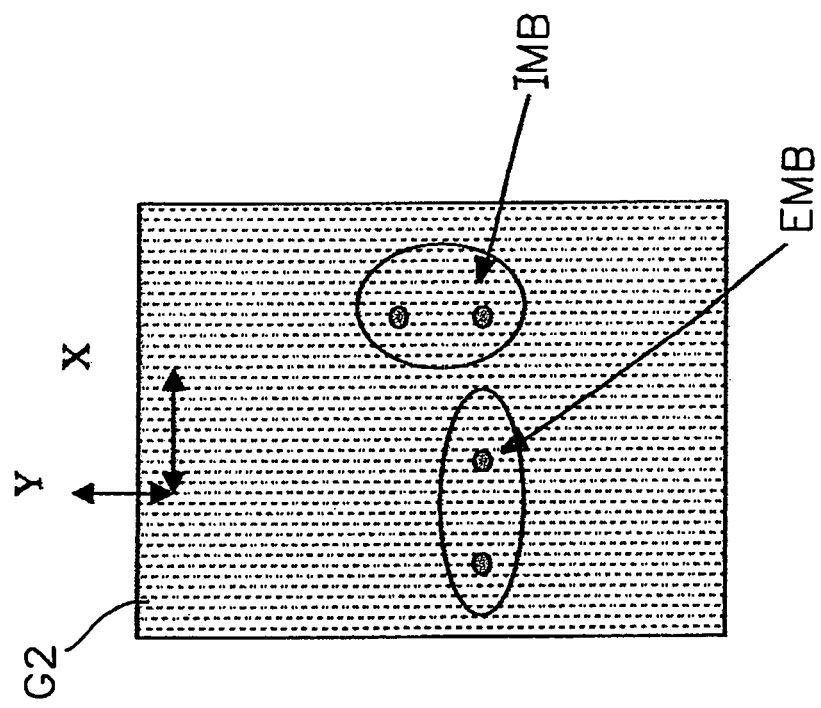
FIGS. 3a and 3b depict a position measurement unit according to a further embodiment of the invention.
Figure 3A:
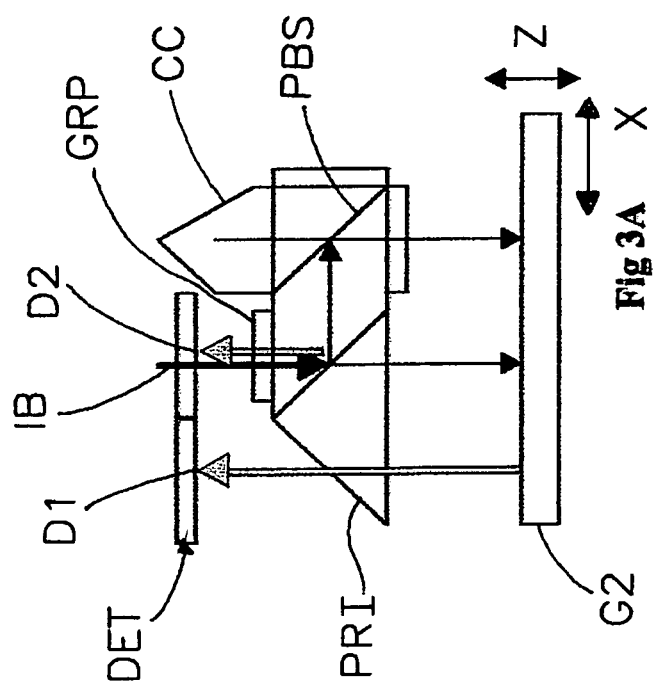

FIGS. 3a and 3b show a further embodiment of the measurement unit, which differs from the embodiment shown and described with reference to FIG. 2a and FIG. 2b in that the corner cube CC deflects the interferometer measurement beam such that it reflects at the grating G2 (as shown in FIG. 3b) twice at locations which differ with respect to each other in the Y dimension. Effectively, corner cube CC in FIG. 3a is thus "rotated" by about 90 degrees with respect to the corner cube as depicted in FIG. 2a. Consequently, also a pattern of the interferometer measurement beam IMB (see FIG. 3b) as reflected onto grating G2 is "rotated" by about 90 degrees with respect to the pattern as depicted in FIG. 2b.

Figure 4B:
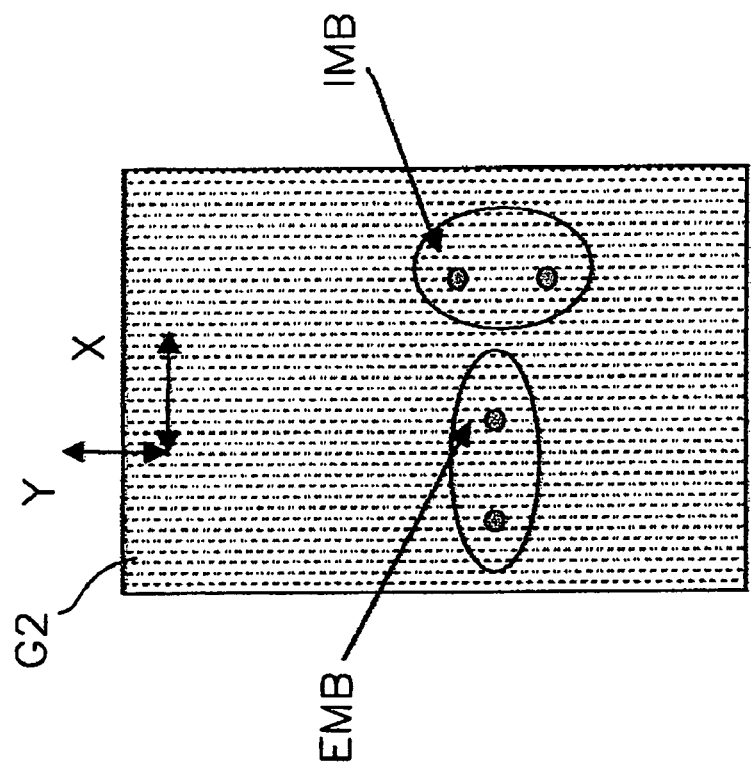
FIGS. 4a and 4b depict a position measurement unit according to a still further embodiment of the invention.
Figure 4A:
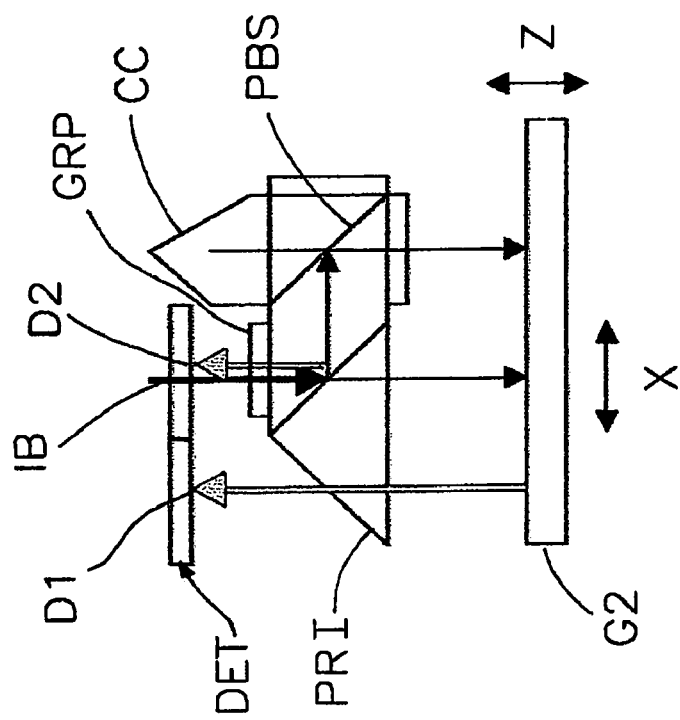

A further example is shown in FIGS. 4a and 4b. Here, the corner cube CC comprises a same orientation as depicted and described with reference to FIGS. 3a and 3b. In the embodiment in FIG. 4a however, use is made of separate input beams for the encoder and the interferometer, the input beams being physically separated from each other in Y direction, which results into a positioning of the interferometer beam and encoder measurement beam on grating G2 as depicted in FIG. 4b: the position where the interferometer measurement beam arrives at grating G2 now is displaced in Y direction as compared to the locations shown in FIG. 3b, due to the physical separation of the input beams in Y directions.

It is further noted that in the embodiments shown in FIG. 3a as well as 4a, the orientation of the corner cube and thus of the interferometer measurement beam IMB having been deflected by the corner cube, results in a different location where the interferometer measurement beam leaves the combined optical unit COU. In FIG. 2a, the corner cube is arranged to twice a reflect the interferometer measurement beam as to provide a displacement along the X axis and therefore detector D2 also is displaced with respect to a position of the incoming beam IB in FIG. 2a in a direction along the X axis. In FIGS. 3a and 4a however the corner cube reflects the interferometer measurement beam twice such that it is effectively displaced in the Y direction, and therefore detector D2 is to be displaced with respect to the incoming beam IB of the interferometer in Y direction also. The same remark holds for FIG. 4.

Figure 5:
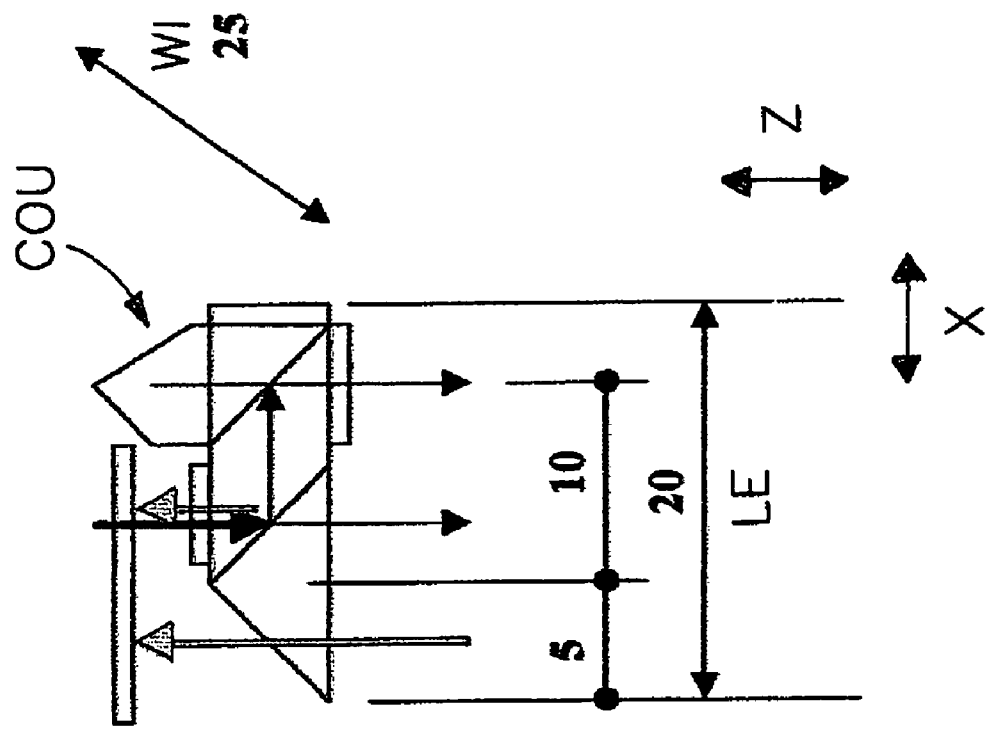
FIG. 5 depicts an example of proportions of a combined optical unit of the position measurement unit according to an embodiment of the invention.

FIG. 5 shows exemplary, proportional dimensions of the combined optical unit, in this particular example the combined optical unit of the embodiment depicted and described with reference to FIG. 3a. Assuming that the combined optical unit COU has a length LA in X dimension of 20, a distance between a side of the prism PRI and a center thereof in X direction may be 5, while a distance between the center of the prism and the center of the polarizing beamsplitter PBS may be 10 and a width WI of the combined optical units COU, (thus a total dimension thereof in Y direction) may be 25. Similar relative dimensions also hold for the embodiments shown in FIG. 2 and FIG. 5. According to an embodiment of the invention, the dimensions shown here may not only be relative dimension, but may also be dimensions in millimetres, thus the common optical unit in a practical embodiment may comprise a length LA of 20 millimetres and a width WI of 25 millimetres.

Figure 7:
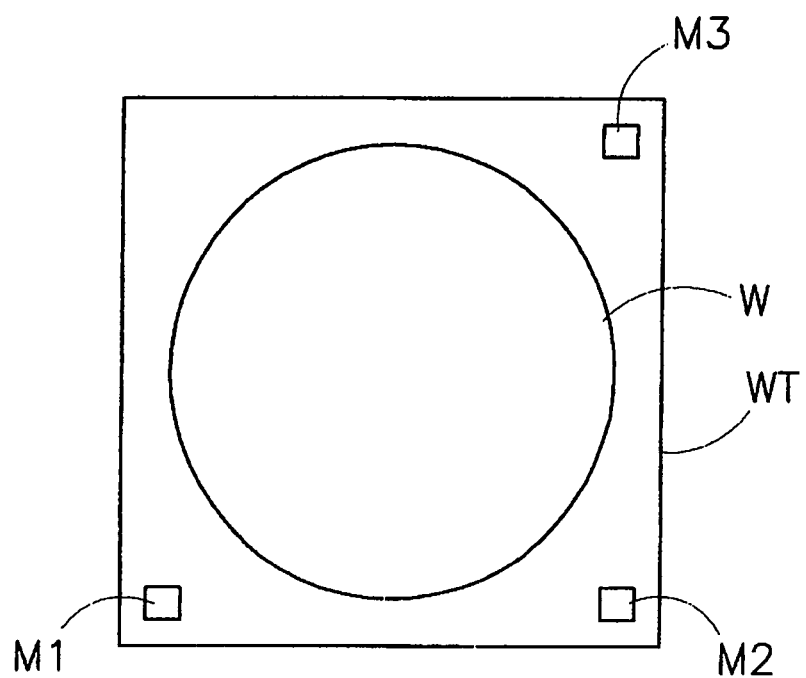
FIG. 7 depicts a measurement system according to an embodiment of the invention.

FIG. 7 shows a top view of the substrate table WT holding a substrate W and measurement units M1, M2 and M3. The measurement units M1, M2 and M3 may be of the construction as described with reference to any one of FIGS. 2a-4a. Measurement unit M1 measures a position in Y direction and in Z direction, measurement unit M2 also measures a position in Y direction and in Z direction, while measurement unit M3 measures a position in X direction and in Z direction. A measurement system of which measurement units M1, M2 and M3 form part, may now derive a position of the substrate table WT from measurement outputs of the measurement units M1, M2 and M3 to determine a position of the substrate table WT in 6 degrees of freedom. The 3 measurement units M1, M2 and M3 may, but not necessarily need to, make use of a common grating G2, a size of which then determines a measurement range in the X/Y plane (the grating G2 being substantially parallel to the X/Y plane. The interferometers of M1, M2 and M3 each measure a position in Z direction, while the encoders of M1, M2 and M3 measure a position in either X or Y direction. A position of the substrate table in the Z dimension, as well as a rotation with respect to the X/Y plane may now be derived from the interferometer read-out of M1, M2 and M3. A position in X and Y dimension may be derived from the encoder read-outs M1, M2 and M3: an averaging of the encoder read-outs M1 and M2 provides a position in Y direction while a difference there between provides for a rotation in the plane of drawing. Finally, the encoder read-out of M3 provides for a position in the X dimension, possibly corrected for a rotation in the plane of drawing as provided by the measurement units M1 and M2. Thus, a highly accurate 6 degrees of freedom position measurement system may be provided making use of only 3 highly integrated, compact measurement units, and providing a large range of movement in X and Y direction (this range of movement being determined by a size of the grid G2 which is not shown here but which is in the X/Y plane), while a range of movement in Z direction in determined by an operation range of the interferometers of the measurement units M1, M2 and M3. In general however, a range of movement of the substrate table in lithography applications in Z direction is substantially smaller than in X resp. Y direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practised otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A measurement unit to determine a position in a first and a second dimension, comprising:
   a diffraction type encoder to determine with a diffraction of an encoder measurement beam on a first and a second diffraction grating the position in the first dimension of the second grating with respect to the first grating,
   an interferometer to determine with an interference between an interferometer measurement beam following a reference path and a measurement path respectively, the position in the second dimension of a mirror in the measurement path, and
   a combined optical unit to transfer the encoder measurement beam as well as the interferometer measurement beam.

2. The measurement unit according to claim 1, wherein the optical unit comprises a prism of the encoder and a polarizing beamsplitter of the interferometer.

3. The measurement unit according to claim 2, the prism comprising a surface that extends under an angle of substantially 45 degrees with respect to a plane formed by the first and second gratings, the surface to transfer the interferometer measurement beam to the polarizing beamsplitter.

4. The measurement unit according to claim 3, wherein the surface of the prism extends substantially parallel to a surface of a polarizing beamsplitter of the interferometer.

5. The measurement unit according to claim 1, wherein the interferometer comprises a homodyne interferometer, the measurement unit comprising a combined light source for the encoder as well as the interferometer.

6. The measurement unit according to claim 5, comprising an incoming beamsplitter positioned to receive an incoming beam from the light source, the incoming beamsplitter to split the incoming beam into the encoder measurement beam and the interferometer measurement beam.

7. The measurement unit according to claim 6, wherein the incoming beamsplitter is positioned on the surface of the prism of the encoder that extends under the angle of substantially 45 degrees with respect to the plane formed by the first and second gratings.

8. The measurement unit according to claim 6, wherein the incoming beamsplitter comprises a non-polarizing beamsplitter.

9. The measurement unit according to claim 1, wherein one of the first and second diffraction gratings comprises a zero order reflection to provide the mirror of the interferometer.

10. The measurement unit according to claim 1, comprising a single detector unit that comprises an encoder detector to detect the encoder measurement beam and an interferometer detector to detect the interferometer measurement beam.

11. The measurement unit according to claim 10, comprising a grating plate positioned in an optical path of the interferometer beam between the combined optical unit and the interferometer detector.

12. The measurement unit according to claim 11, wherein the single detector unit comprises a single printed circuit board.

13. The measurement unit according to claim 1, wherein a corner cube of the interferometer is constructed to deflect the interferometer measurement beam in a direction substantially perpendicular to the first dimension.

14. The measurement unit according to claim 1, wherein the corner cube of the interferometer is constructed to deflect the interferometer measurement beam in a direction substantially parallel to the first dimension.

15. A measurement system to determine a position of an object in six degrees of freedom, the measurement system comprising three measurement units, each of the three measurement units configured to determine a position in a first and a second dimension and including:
   a diffraction type encoder to determine with a diffraction of an encoder measurement beam on a first and a second diffraction grating the position in the first dimension of the second grating with respect to the first grating,
   an interferometer to determine with an interference between an interferometer measurement beam following a reference path and a measurement path respectively, the position in the second dimension of a mirror in the measurement path, and a combined optical unit to transfer the encoder measurement beam as well as the interferometer measurement beam.

16. The measurement system according to claim 15, the three measurement units being positioned along a surface, each of the interferometers of the 3 units to determine a position of the respective unit in a dimension substantially perpendicular to the surface, each of the encoders to determine a position in a dimension substantially parallel to the surface.

17. The measurement system according to claim 16, wherein the three measurement units comprise a common second diffraction grating, the grating comprising a zero order reflection to provide the mirror of the interferometers.

18. A lithographic apparatus comprising a measurement unit. the measurement unit configured to determine a position in a first and a second dimension and including:

a diffraction type encoder to determine with a diffraction of an encoder measurement beam on a first and a second diffraction grating the position in the first dimension of the second grating with respect to the first grating, an interferometer to determine with an interference between an interferometer measurement beam following a reference path and a measurement path respectively, the position in the second dimension of a minor in the measurement path, and a combined optical unit to transfer the encoder measurement beam as well as the interferometer measurement beam, the measurement unit being connected to a substrate table to measure a position of the substrate table.

19. A lithographic apparatus comprising a measurement unit, the measurement unit conflaured to determine a position in a first and a second dimension and including:

a diffraction type encoder to determine with a diffraction of an encoder measurement beam on a first and a second diffraction aratina the position in the first dimension of the second grating with respect to the first grating, an interferometer to determine with an interference between an interferometer measurement beam following a reference path and a measurement path respectively, the position in the second dimension of a mirror in the measurement path, and a combined optical unit to transfer the encoder measurement beam as well as the interferometer measurement beam, the measurement unit being connected to a mask table to measure a position of the mask table.

* * * * *